(12) United States Patent
Song et al.

(10) Patent No.: US 11,963,390 B2
(45) Date of Patent: Apr. 16, 2024

(54) LIGHT-EMITTING DEVICE AND DISPLAY APPARATUS INCLUDING THE SAME

(71) Applicant: Samsung Electronics Co., Ltd., Suwon-si (KR)

(72) Inventors: Sunjin Song, Seoul (KR); Wonjae Joo, Seongnam-si (KR); Hyun Koo, Seongnam-si (KR); Jisoo Kyoung, Seoul (KR); Sunghoon Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 194 days.

(21) Appl. No.: 16/990,516

(22) Filed: Aug. 11, 2020

(65) Prior Publication Data
US 2021/0296616 A1    Sep. 23, 2021

(30) Foreign Application Priority Data

Mar. 17, 2020  (KR) ........................ 10-2020-0032852

(51) Int. Cl.
*H10K 50/852*    (2023.01)
*H10K 50/125*    (2023.01)
(Continued)

(52) U.S. Cl.
CPC ......... *H10K 50/852* (2023.02); *H10K 50/125* (2023.02); *H10K 50/131* (2023.02);
(Continued)

(58) Field of Classification Search
CPC ............. H01L 51/5262; H01L 51/5265; H01L 51/5271; H01L 51/5036; H01L 51/504;
(Continued)

(56) References Cited

U.S. PATENT DOCUMENTS

| | | |
|---|---|---|
| 5,554,911 A | 9/1996 | Nakayama et al. |
| 8,614,698 B2 | 12/2013 | Desieres et al. |

(Continued)

FOREIGN PATENT DOCUMENTS

| | | |
|---|---|---|
| EP | 3614447 A | 2/2020 |
| JP | H6275381 A | 9/1994 |

(Continued)

OTHER PUBLICATIONS

Extended European Search Report for Application No. 20190959.5-1211 dated Feb. 4, 2021.
(Continued)

*Primary Examiner* — Shaun M Campbell
*Assistant Examiner* — Aneta B Cieslewicz
(74) *Attorney, Agent, or Firm* — CANTOR COLBURN LLP

(57) ABSTRACT

A light-emitting device and a display apparatus including the same are provided. The light-emitting device includes a metal reflective layer having a phase modulation surface, a first electrode on the metal reflective layer, an organic emission layer which is provided on the first electrode and emits white light, and a second electrode on the organic emission layer. The phase modulation surface includes a plurality of protrusions and a plurality of recesses.

33 Claims, 9 Drawing Sheets

(51) Int. Cl.
  *H10K 50/13* (2023.01)
  *H10K 50/805* (2023.01)
  *H10K 50/856* (2023.01)
  *H10K 59/30* (2023.01)
  *H10K 102/00* (2023.01)
(52) U.S. Cl.
  CPC ......... *H10K 50/805* (2023.02); *H10K 50/856* (2023.02); *H10K 59/30* (2023.02); *H10K 2102/3026* (2023.02); *H10K 2102/351* (2023.02)
(58) Field of Classification Search
  CPC ............. H01L 51/5044; H01L 51/5225; H01L 51/5218; H01L 51/5203; H01L 2251/5307; H01L 2251/5315; H01L 2251/558; H01L 27/3206; H01L 27/3211; H10K 50/85; H10K 50/852; H10K 50/856; H10K 50/125; H10K 50/13; H10K 50/131; H10K 50/805; H10K 59/878; H10K 59/875; H10K 59/876; H10K 59/30; H10K 59/32; H10K 59/805; H10K 2102/3026; H10K 2102/351; H10K 2102/3023
  See application file for complete search history.

(56) References Cited

U.S. PATENT DOCUMENTS

| | | | |
|---|---|---|---|
| 8,779,424 | B2 | 7/2014 | Matsuzaki |
| 2005/0225233 | A1 | 10/2005 | Boroson et al. |
| 2005/0258429 | A1 | 11/2005 | Cok et al. |
| 2005/0280362 | A1 | 12/2005 | Shore et al. |
| 2011/0151607 | A1 | 6/2011 | Landis et al. |
| 2014/0191202 | A1 | 7/2014 | Shim et al. |
| 2017/0207421 | A1 | 7/2017 | Matsuzaki et al. |
| 2018/0097160 | A1* | 4/2018 | Lopez ................... H01L 33/145 |
| 2019/0198817 | A1 | 6/2019 | Joo et al. |
| 2020/0058905 | A1 | 2/2020 | Kyoung et al. |
| 2020/0227685 | A1 | 7/2020 | Kyoung et al. |
| 2020/0241353 | A1 | 7/2020 | Lee et al. |
| 2020/0243800 | A1 | 7/2020 | Joo et al. |
| 2020/0403037 | A1 | 12/2020 | Joo et al. |
| 2021/0280832 | A1* | 9/2021 | Koo ...................... H10K 50/852 |
| 2021/0288290 | A1 | 9/2021 | Lee et al. |

FOREIGN PATENT DOCUMENTS

| | | | |
|---|---|---|---|
| JP | 2010097883 | * | 4/2010 |
| JP | 2010097883 | A | 4/2010 |
| JP | 5307307 | B1 | 7/2013 |
| KR | 1020090091706 | A | 8/2009 |
| KR | 101064064 | B1 | 9/2011 |
| WO | 2016047045 | A1 | 3/2016 |

OTHER PUBLICATIONS

Peter B. Catrysse et al., Propagating modes in subwavelength cylindrical holes, 2005, p. 2675-2678, vol. 23, No. 6.
Reuven Gordon et al., Increased cut-off wavelength for a subwavelength hole in a real metal, 2005, p. 1933-1938, vol. 13, No. 6, Optics Express.

* cited by examiner

[FIG. 1]
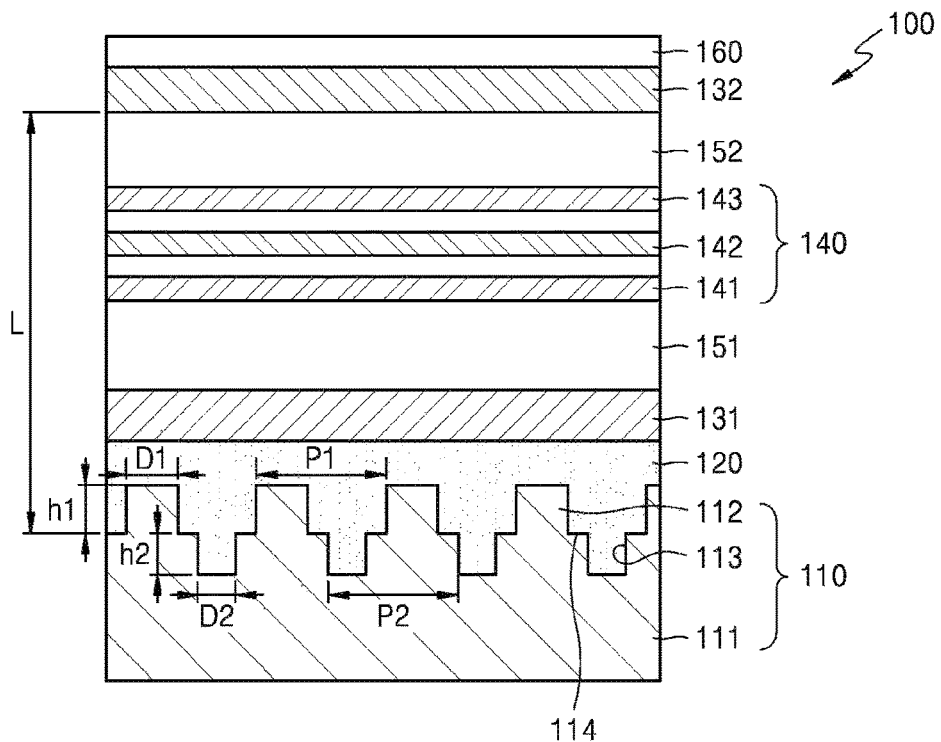
[FIG. 2]
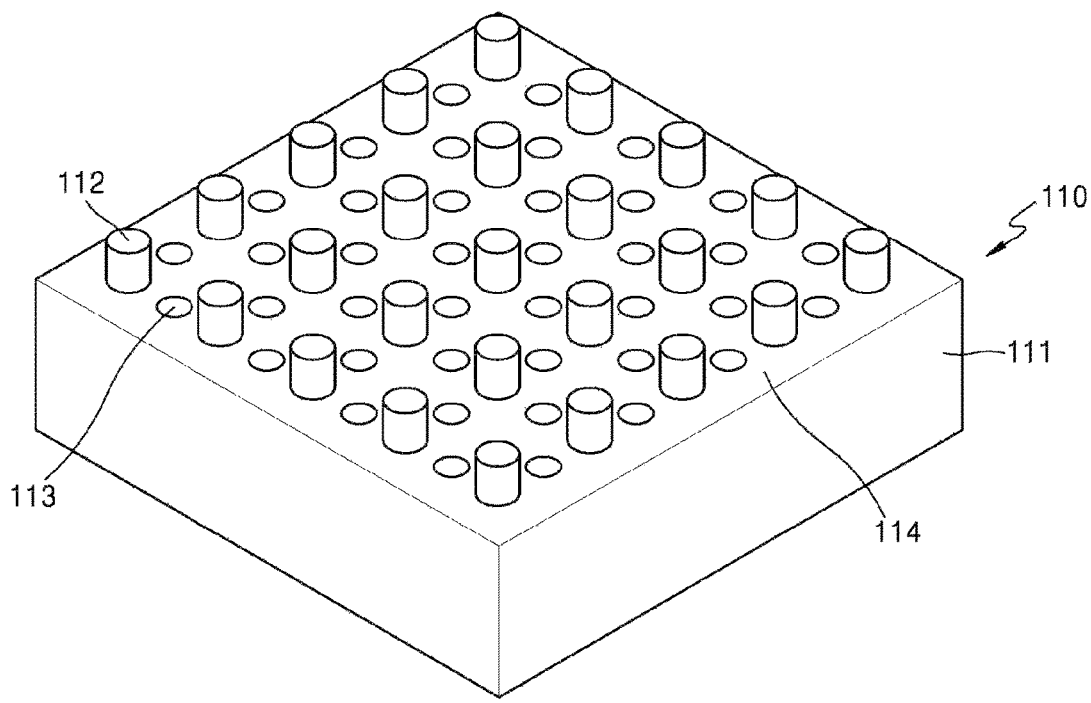

[FIG. 3]
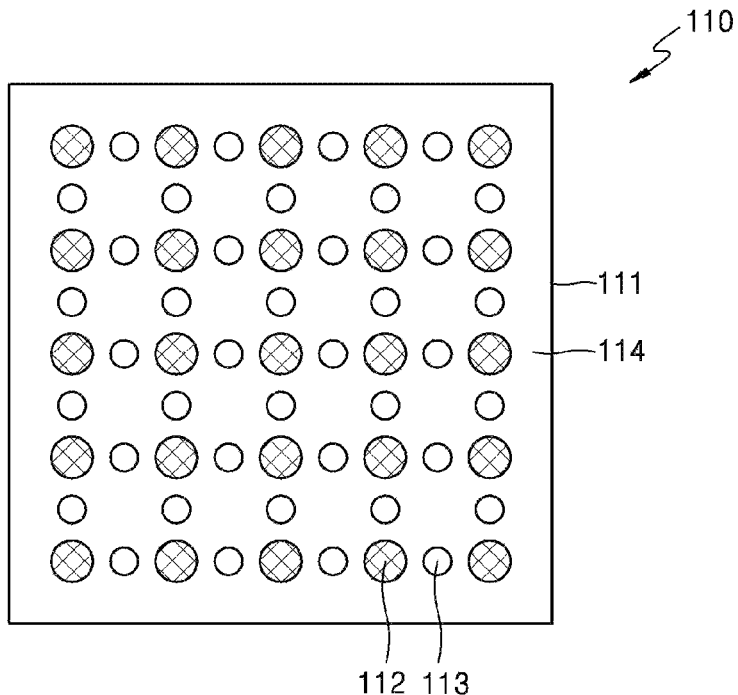
[FIG. 4A]
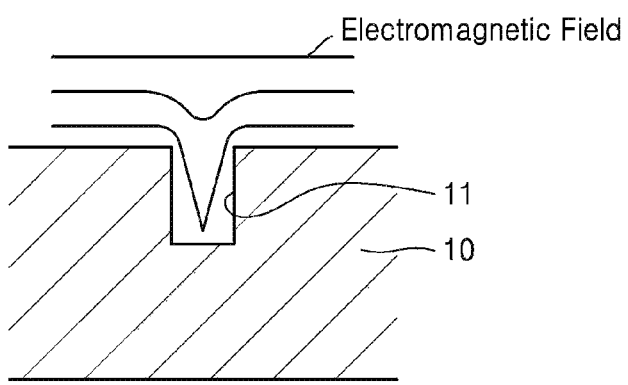
[FIG. 4B]
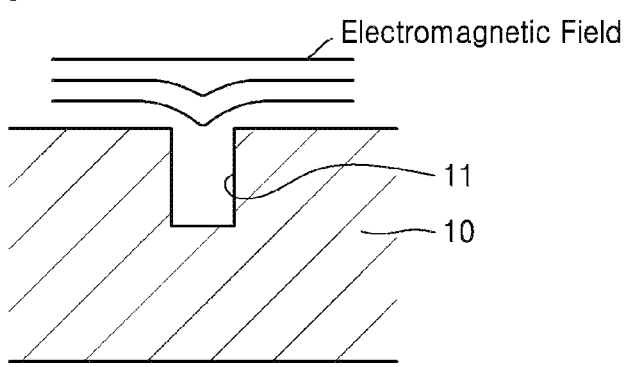

[FIG. 5]
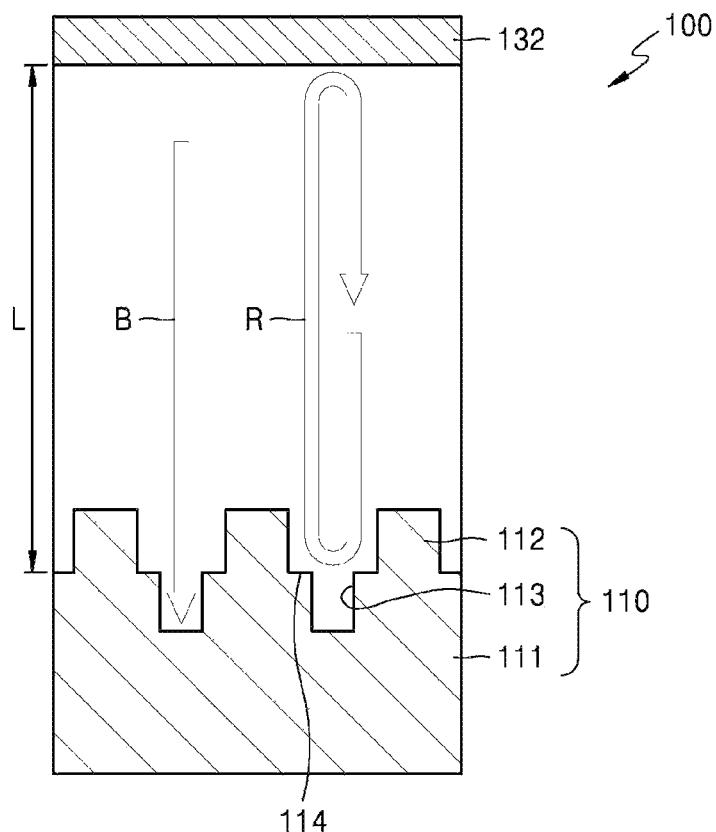
[FIG. 6]
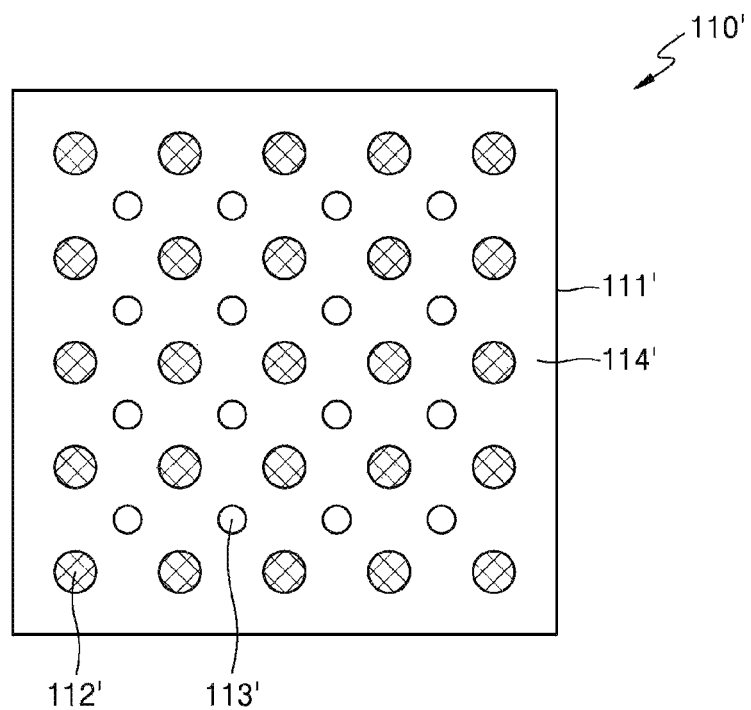

[FIG. 7]
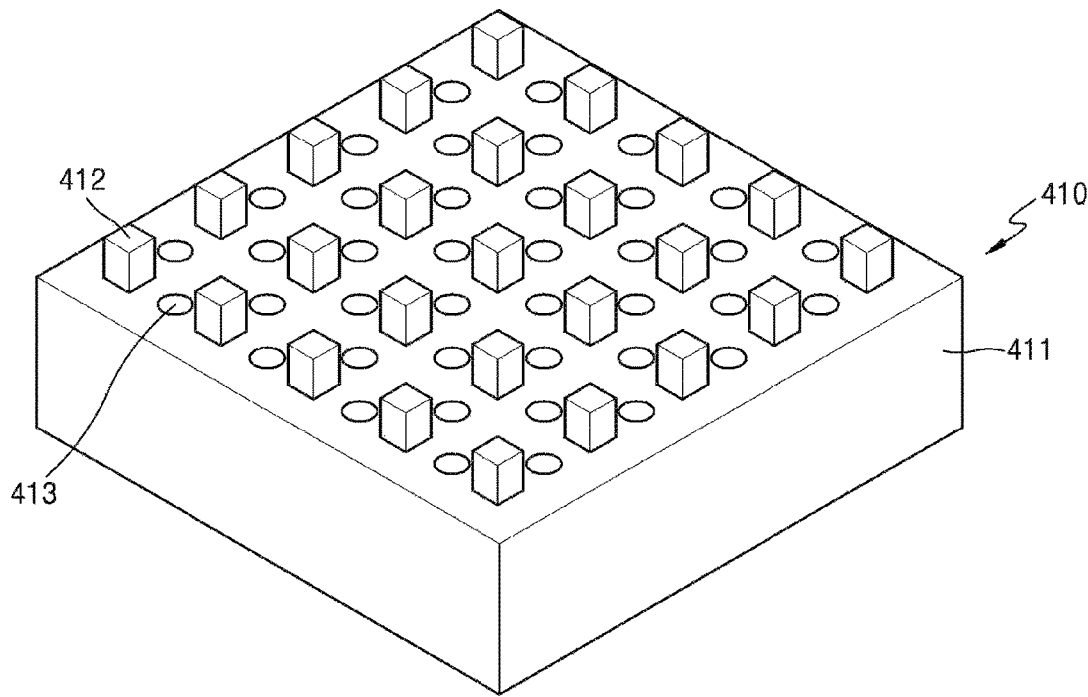
[FIG. 8]
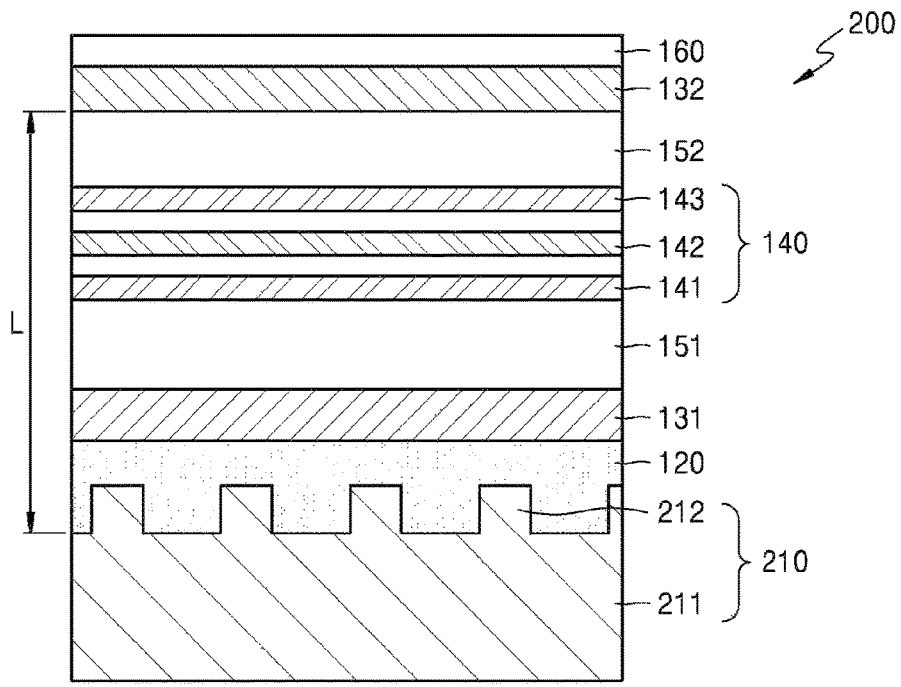

[FIG. 9]
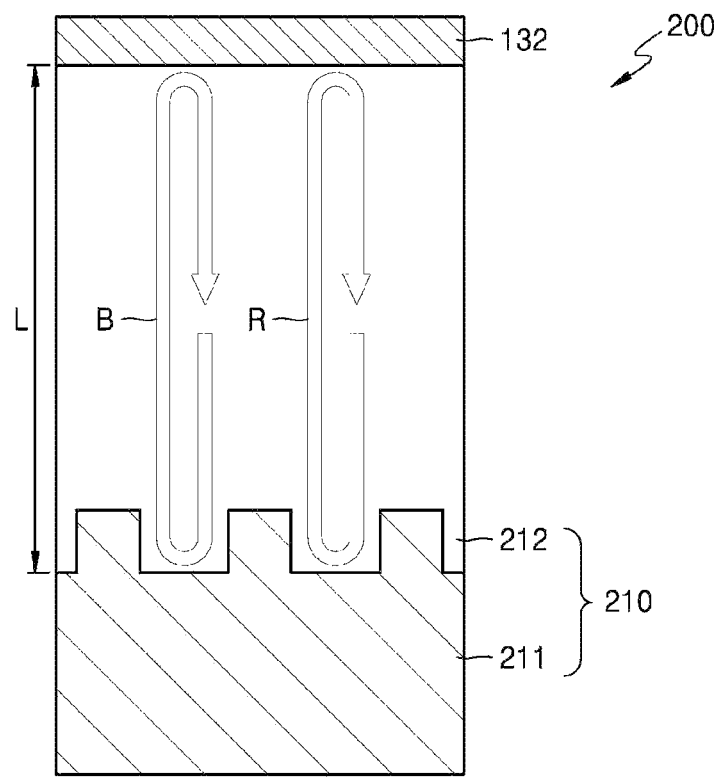
[FIG. 10]
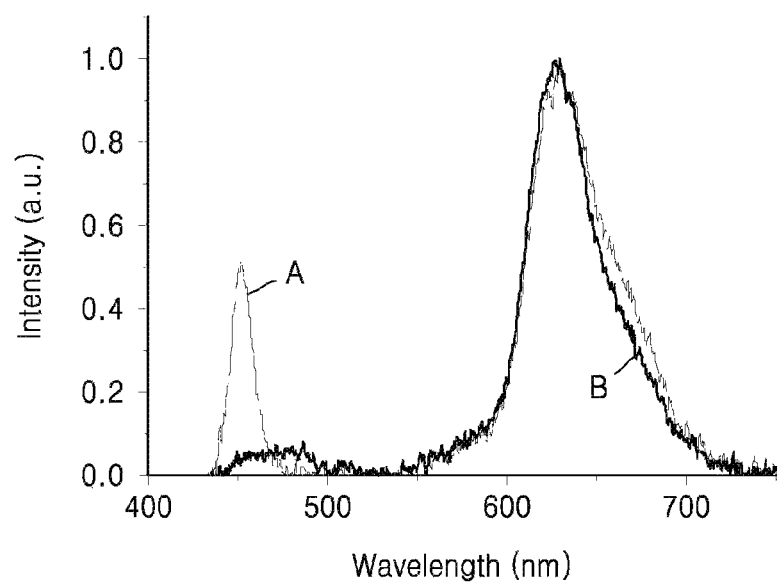

[FIG. 11]
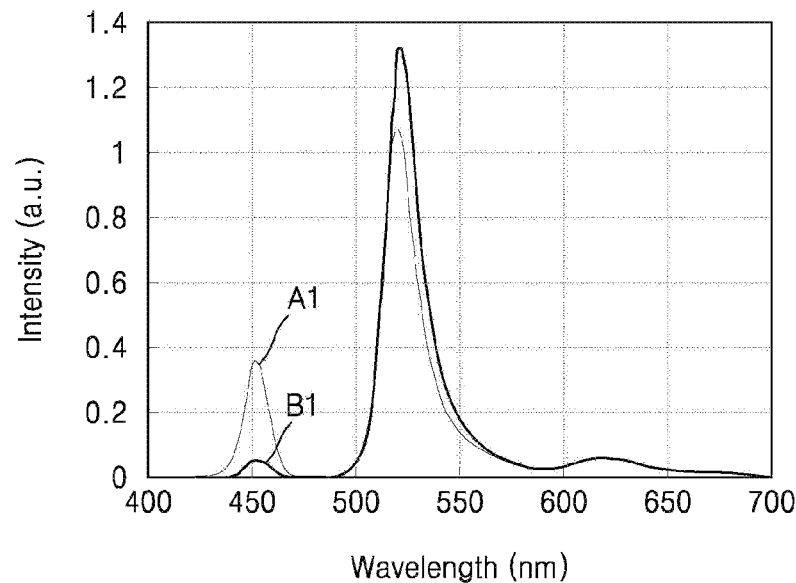
[FIG. 12]
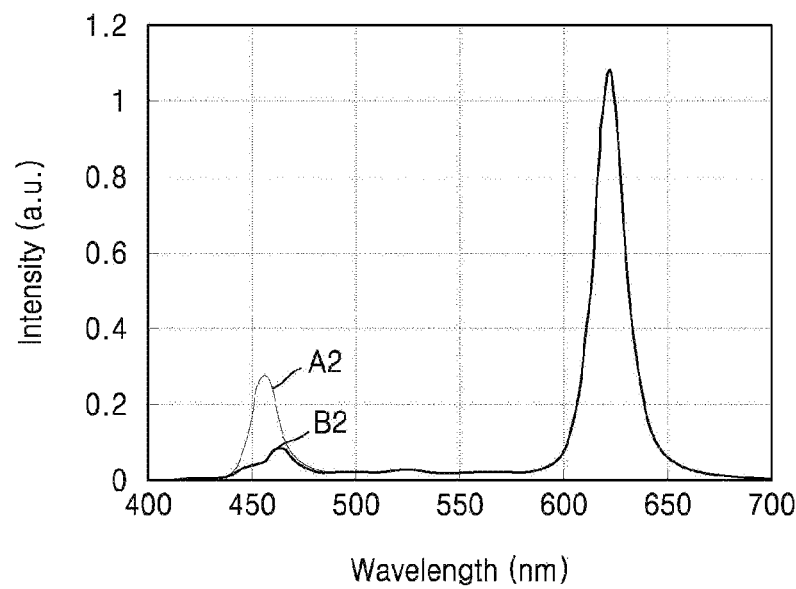

[FIG. 13]
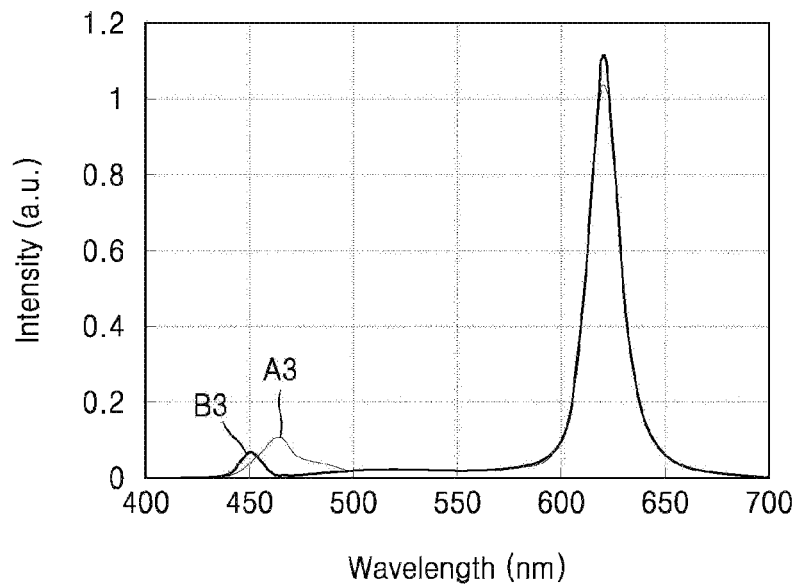
[FIG. 14]
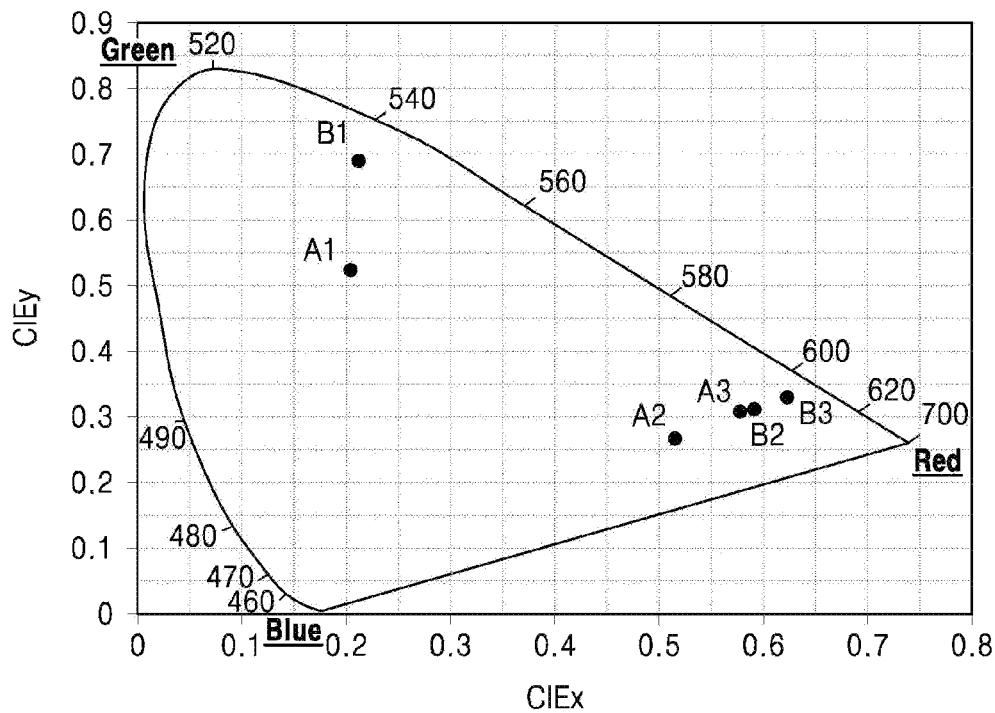

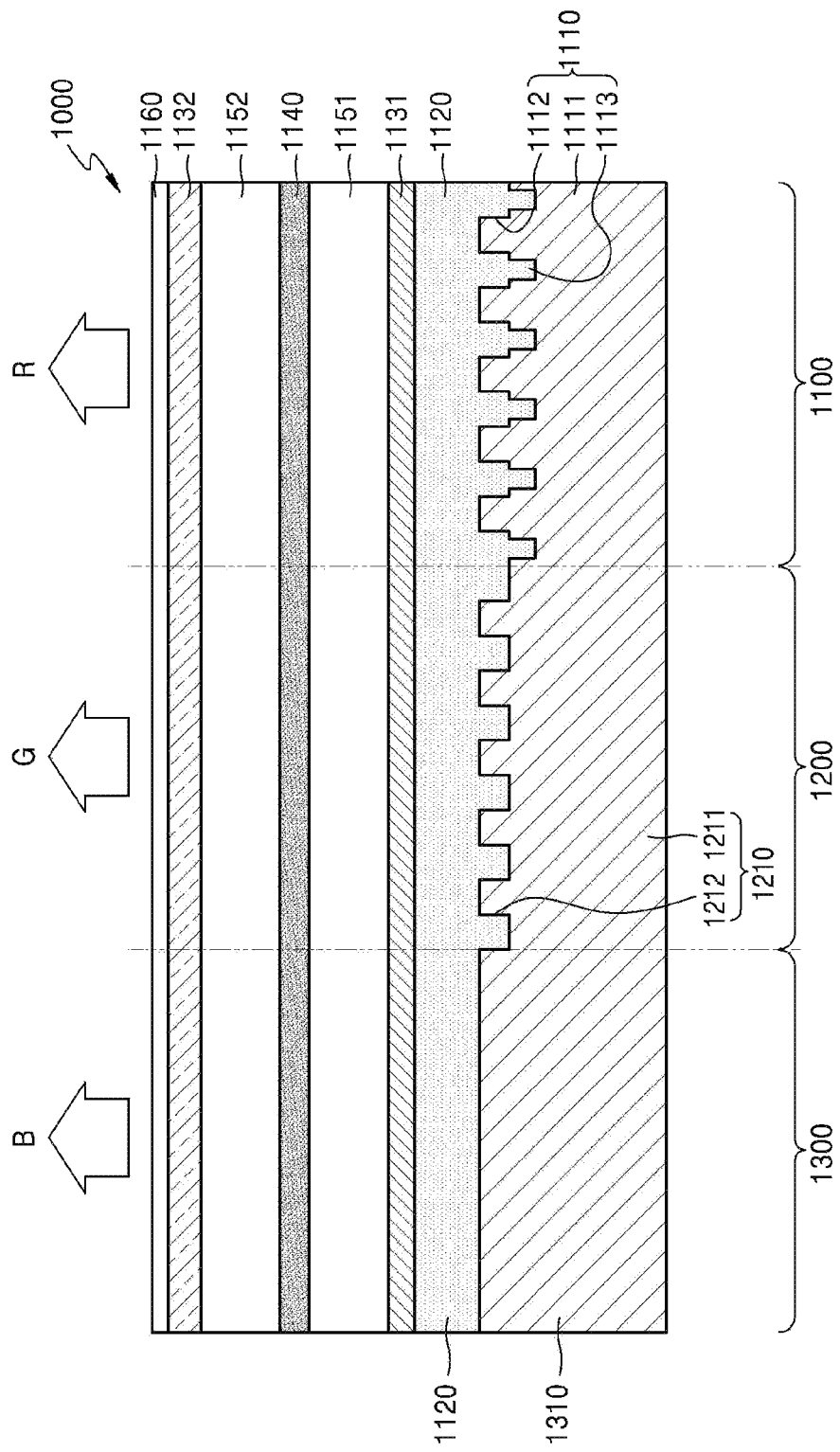

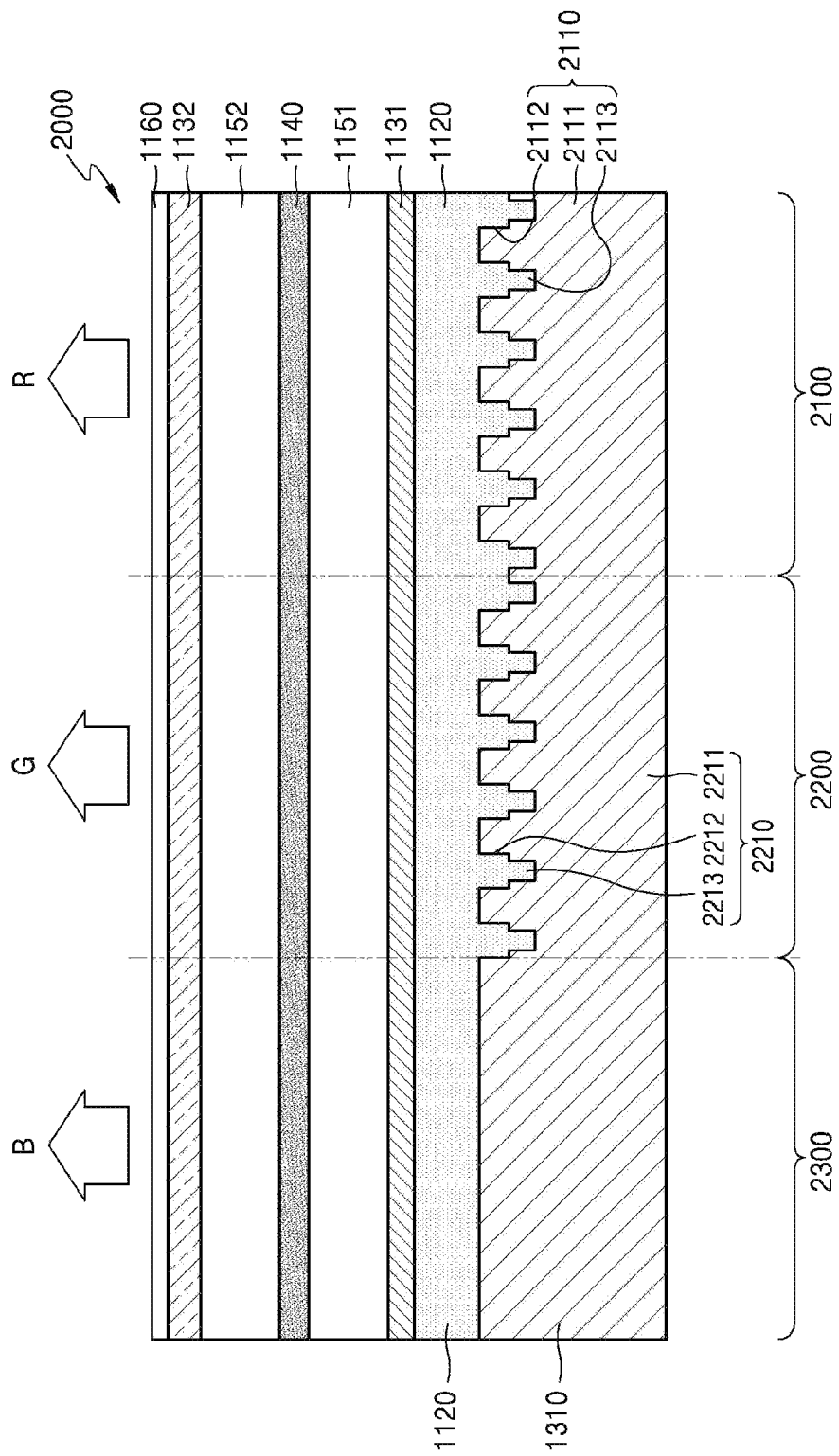

LIGHT-EMITTING DEVICE AND DISPLAY APPARATUS INCLUDING THE SAME

CROSS-REFERENCE TO RELATED APPLICATION

This application claims priority to Korean Patent Application No. 10-2020-0032852, filed on Mar. 17, 2020, and all the benefits accruing therefrom under 35 U.S.C. § 119, the content of which in its entirety is herein incorporated by reference.

BACKGROUND

1. Field

The present disclosure relates to a light-emitting device and a display apparatus including the same.

2. Description of Related Art

An organic light-emitting device ("OLED") emits light of a certain color when holes supplied from an anode and electrons supplied from a cathode are combined in an organic emission layer. A display apparatus using such an OLED may exhibit excellent display characteristics such as a wide viewing angle, a high response rate, a thin thickness, and a high contrast rate.

SUMMARY

Provided are light-emitting devices and display apparatuses including the same.

Additional aspects will be set forth in part in the description which follows and, in part, will be apparent from the description, or may be learned by practice of the presented embodiments of the disclosure.

According to an aspect of an embodiment, a light-emitting device includes a metal reflective layer having a phase modulation surface; a first electrode on the metal reflective layer; an organic emission layer provided on the first electrode and which emits white light; and a second electrode on the organic emission layer. The phase modulation surface includes a plurality of protrusions and a plurality of recesses.

The metal reflective layer and the second electrode may define a micro-cavity of a predetermined resonance wavelength.

A light of a first wavelength may resonate by the plurality of protrusions, and a light of a second wavelength may be absorbed by the plurality of recesses.

The first wavelength may be greater than the second wavelength.

The light of the first wavelength may include red light or green light. The light of the second wavelength may include blue light.

The phase modulation surface may have a meta structure in which the plurality of protrusions and the plurality of recesses are provided at regular intervals.

Each of the plurality of protrusions and the plurality of recesses may have a cylindrical shape or a polyprism shape.

Each of the plurality of protrusions and the plurality of recesses may have a dimension less than a wavelength of incident light.

Each of the plurality of recesses may have a diameter of about 80 nanometers (nm) to about 250 nm. A difference between a diameter of each of the plurality of protrusions and a diameter of each of the plurality of recesses may be about 100 nm or less. Each of the plurality of protrusions and the plurality of recesses may have a depth of about 20 nm to about 100 nm.

The metal reflective layer may include at least one metal material of silver (Ag), aluminum (Al), and gold (Au).

The light-emitting device may further include a dielectric layer between the metal reflective layer and the first electrode to cover the phase modulation surface of the metal reflective layer.

The light-emitting device may further include a passivation layer on the second electrode.

According to an aspect of another embodiment, a display apparatus includes a plurality of pixels which emits light of different colors. At least one of the plurality of pixels includes a metal reflective layer having a phase modulation surface; a first electrode on the metal reflective layer; an organic emission layer provided on the first electrode and which emits white light; and a second electrode on the organic emission layer. The phase modulation surface includes a plurality of protrusions and a plurality of recesses.

A light of a first wavelength may resonate by the plurality of protrusions, and a light of a second wavelength smaller than the first wavelength may be absorbed by the plurality of recesses.

Each of the plurality of protrusions and the plurality of recesses may have a dimension less than a wavelength of incident light, and the phase modulation surface may have a meta structure in which the plurality of protrusions and the plurality of recesses are provided at regular intervals.

A dielectric layer may be provided between the metal reflective layer and the first electrode to cover the phase modulation surface of the metal reflective layer.

A passivation layer may be provided on the second electrode.

The plurality of pixels may include a blue pixel, a green pixel, and a red pixel, and the red pixel may include the plurality of protrusions and the plurality of recesses.

The plurality of pixels may include a blue pixel, a green pixel, and a red pixel, and each of the red pixel and the green pixel may include the plurality of protrusions and the plurality of recesses.

According to an aspect of another embodiment, a light-emitting device includes a metal reflective layer; a second electrode spaced apart from the metal reflective layer; a first electrode between the metal reflective layer and the second electrode; and an emission layer which is located between the first electrode and the second electrode and emits visible light, where the visible light includes a light of a first wavelength and a light of a second wavelength. The metal reflective layer includes a surface facing the first electrode, a plurality of protrusions protruding from the surface, and a plurality of recesses defined in the surface.

The light of the first wavelength may resonate by the plurality of protrusions, and the light of the second wavelength may be absorbed by the plurality of recesses.

An area occupied by each of the plurality of protrusions may be greater than or equal to an area occupied by each of the plurality of recesses in a plan view.

An area of the surface may be larger than an area occupied by the plurality of protrusions in the plan view. An area of the surface may be larger than an area occupied by the plurality of recesses in the plan view.

The visible light may include white light. The emission layer may be an organic emission layer.

The light of the first wavelength may be red light, and the light of the second wavelength may be blue light.

The light of the first wavelength may be green light, and the light of the second wavelength may be blue light.

Each of the plurality of protrusions and the plurality of recesses may have a dimension smaller than a wavelength of the visible light.

Each of the plurality of recesses may have a diameter of about 80 nm to about 250 nm.

The light-emitting device may further include a dielectric layer to cover the surface, the plurality of protrusions, and the plurality of recesses.

BRIEF DESCRIPTION OF THE DRAWINGS

The above and other aspects of certain embodiments of the disclosure will be more apparent from the following description taken in conjunction with the accompanying drawings, in which:

FIG. 1 is a cross-sectional view of a light-emitting device according to an embodiment;

FIG. 2 is a perspective view of a metal reflective layer of FIG. 1;

FIG. 3 is a plan view of the metal reflective layer of FIG. 1;

FIG. 4A illustrates an example in which short-wavelength light flows into a recess formed in a surface of a metal mirror;

FIG. 4B illustrates an example in which long-wavelength light is blocked by the surface of the metal mirror having the recess;

FIG. 5 illustrates an example in which light resonates in a light-emitting device according to an embodiment;

FIG. 6 is a plan view of another example of a metal reflective layer which may be employed in the light-emitting device of FIG. 1;

FIG. 7 is a perspective view of another example of a metal reflective layer which may be employed in the light-emitting device of FIG. 1;

FIG. 8 illustrates a light-emitting device according to a comparative example;

FIG. 9 illustrates resonance of light in the light-emitting device 200 of FIG. 8;

FIG. 10 illustrates a comparison between a spectrum of light emitted from a light-emitting device with a metal reflective layer having a flat surface and a spectrum of light emitted from a light-emitting device with a metal reflective layer having recesses in a surface thereof;

FIG. 11 illustrates a comparison between a spectrum of light emitted from a light-emitting device of a first comparative example and a spectrum of light emitted from a light-emitting device of a first embodiment;

FIG. 12 illustrates a comparison between a spectrum of light emitted from a light-emitting device of a second comparative example and a spectrum of light emitted from a light-emitting device of a second embodiment;

FIG. 13 illustrates a comparison between a spectrum of light emitted from a light-emitting device of a third comparative example and a spectrum of light emitted from a light-emitting device of a third embodiment;

FIG. 14 is a comparison between color coordinates of light emitted from the light-emitting devices of the first, second and third comparative examples and color coordinates of light emitted from the light-emitting devices of the first, second and third embodiments;

FIG. 15 is a cross-sectional view of a display apparatus according to an embodiment; and FIG. 16 is a cross-sectional view of a display apparatus according to another embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the drawings, the same reference numerals represent the same elements, and a size of each element may be exaggerated for clarity and convenience of description. Embodiments described below are merely examples and various modifications may be made therein.

It will be understood that when one element is referred to as being "on" or "above" another element, the element may be on the other element in direct contact with the other element or without contacting the other element. As used herein, the singular expressions are intended to include plural forms as well, unless the context clearly dictates otherwise. It will be understood that when an element is referred to as "including" another element, the element may further include other elements unless mentioned otherwise.

The term "the" and demonstratives similar thereto may be understood to include both singular and plural forms. Unless explicitly stated or contrary to operations included in methods, the operations may be performed in an appropriate order and are not necessarily limited to the order described herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Terms such as "unit", "module," and the like, when used herein, represent units for processing at least one function or operation, which may be implemented by hardware, software, or a combination of hardware and software.

Lines or members connecting components illustrated in the drawings are illustrative of functional connections and/or physical or circuit connections between the components and thus may be replaced or various functional, physical or circuit connections may be added in an actual device.

All examples or terms used herein are merely provided to describe the technical spirit of the present disclosure in detail and thus the scope of the present disclosure should not be construed as being limited by the examples or terms unless they are defined in the claims.

FIG. 1 is a cross-sectional view of a light-emitting device according to an embodiment. FIG. 2 is a perspective view of a metal reflective layer of FIG. 1. FIG. 3 is a plan view of the metal reflective layer of FIG. 1.

Referring to FIGS. 1 to 3, a light-emitting device 100 includes a metal reflective layer 110 having a phase modulation surface, a first electrode 131 on the metal reflective layer 110, an organic emission layer 140 on the first electrode 131, and a second electrode 132 on the organic emission layer 140.

A dielectric layer 120 may be provided between the metal reflective layer 110 and the first electrode 131 to cover the phase modulation surface of the metal reflective layer 110. The dielectric layer 120 may protect the phase modulation surface of the metal reflective layer 110 and planarize an upper portion of the phase modulation surface for uniform current density. To this end, the dielectric layer 120 may be provided to cover the phase modulation surface of the metal reflective layer 110 so as to provide a flat surface above the upper surface of the metal reflective layer 110. The dielectric layer 120 may include an insulating material that is transparent enough for a visible light to pass therethrough. The dielectric layer 120 may include, for example, $SiO_2$, SiNx, $Al_2O_3$, or $HfO_2$ but is not limited thereto.

The organic emission layer 140 emits white light, and has a structure in which a red organic emission layer 141, a green organic emission layer 142, and a blue organic emission layer 143 are sequentially stacked between the first electrode 131 and the second electrode 132. Here, for example, an exciton blocking layer may be provided between the red organic emission layer 141 and the green organic emission layer 142 and between the green organic emission layer 142 and the blue organic emission layer 143.

The first electrode 131 may serve as an anode that provides holes to the organic emission layer 140, and the second electrode 132 may serve as a cathode that provides electrons to the organic emission layer 140. To this end, the first electrode 131 may be formed of or include a material having a relatively high work function, and the second electrode 132 may be formed of or include a material having a relatively low work function.

The first electrode 131 may be a transparent electrode that is capable to transmit light. For example, the first electrode 131 may include a transparent conductive oxide such as indium tin oxide ("ITO"), indium zinc oxide ("IZO"), or aluminum zinc oxide ("AZO").

The second electrode 132 may be a semi-transmissive electrode that is capable to reflect part of light and transmit part of the light. The second electrode 132 may include a thin metal. For example, the second electrode 132 may be a mixed layer of silver (Ag) and magnesium (Mg) or a mixed layer of aluminum (Al) and lithium (Li). The second electrode 132 may have a thickness of about 10 nanometers (nm) to about 20 nm. The second electrode 132 has a thin thickness and thus part of light may pass through the second electrode 132. A passivation layer 160 may be provided on a surface of the second electrode 132.

A hole injection layer 151 may be provided between the first electrode 131 and the organic emission layer 140. Although not shown, a hole transport layer may be further provided between the hole injection layer 151 and the organic emission layer 140. An electron injection layer 152 may be provided between the second electrode 132 and the organic emission layer 140. Although not shown, an electron transfer layer may be further provided between the electron injection layer 152 and the organic emission layer 140.

Various additional layers may be further provided in another embodiment. For example, an electron blocking layer may be further provided between the hole transport layer and the organic emission layer 140, and a hole blocking layer may be further provided between the electron transport layer and the organic emission layer 140.

Holes provided from the first electrode 131 through the hole injection layer 151 and electrons provided from the second electrode 132 through the electron injection layer 152 are combined in the red, green, and blue organic emission layers 141, 142, and 143. Thus, the red, green, and blue organic emission layers 141, 142, and 143 generate red light, green light, and blue light, respectively.

The metal reflective layer 110 defines a micro-cavity L together with the second electrode 132. Accordingly, the micro-cavity L may be defined between the metal reflective layer 110 and the second electrode 132. For example, light generated from the organic emission layer 140 may resonate while reciprocating between the metal reflective layer 110 and the second electrode 132, and thereafter light corresponding to a resonance wavelength of the micro-cavity L may be discharged to the outside via the second electrode 132. That is, the micro-cavity L is defined by two layers which may reflect lights, and allows transparent materials to be filled therein.

The resonance wavelength of the micro-cavity L may be determined by an optical length of the micro-cavity L. For example, when the resonance wavelength of the micro-cavity L is $\lambda$, the optical length of the micro-cavity L may be $n\lambda/2$ (n is a natural number). The optical length of the micro-cavity L may be determined by the sum of an optical thickness of layers constituting the micro-cavity L between the metal reflective layer 110 and the second electrode 132, a degree of phase delay caused by the second electrode 132, and a degree of phase shift (e.g., phase delay) caused by the reflective layer 110. Here, the optical thickness of the layers constituting the micro-cavity L does not refer to a simple physical thickness but refers to a thickness in a third direction DR3 determined in consideration of refractive indexes of the layers.

The optical length or the resonance wavelength of the micro-cavity L may be adjusted by adjusting only a degree of phase shift caused by the metal reflective layer 110 while fixing the optical thickness of the layers constituting the micro-cavity L and the degree of phase delay caused by the second electrode 132.

In order to adjust the degree of phase shift caused by the metal reflective layer 110, a phase modulation surface is provided on a reflective surface of the metal reflective layer 110. Here, the phase modulation surface may have a meta structure in which nano patterns smaller in size than a wavelength of incident light (e.g., visible light) are provided at regular intervals. The metal reflective layer 110 includes a base part 111 and a phase modulation surface on an upper surface 114 of the base part 111.

The phase modulation surface includes a plurality of protrusions 112 and a plurality of recesses 113 which are provided at regular intervals on the upper surface 114 of the base part 111 facing the first electrode 131. A dimension of each of the plurality of protrusions 112 projecting from the upper surface 114 and the plurality of recesses 113 defined in the upper surface 114 may be smaller than a wavelength of incident light. As illustrated in FIGS. 2 and 3, the plurality of protrusions 112 and the plurality of recesses 113 may be spaced apart from each other, and an area occupied by the upper surface 114 may be greater than an area (on a plane defined by a first direction DR1 and a second direction DR2 or in a plan view) occupied by the plurality of protrusions 112 or the plurality of recesses 113. An area occupied by each of the plurality of protrusions 112 may be greater than or equal to that occupied by each of the plurality of recesses 113. Here, the direction DR3 is perpendicular to the plane defined by the first direction DR1 and the second direction DR2.

As described later, light of a first wavelength (e.g., red light or green light) for which resonation is desired may resonate by the plurality of protrusions 112, and light of a second wavelength (e.g., blue light) for which resonation is not desired may be absorbed by the plurality of recesses 113.

The plurality of protrusions 112 may be provided at a regular interval of a pitch P1 on the upper surface 114 of the base part 111. FIG. 3 illustrates, as an example, a case in which the protrusions 112 are provided at regular intervals in a square shape. However, the case of FIG. 3 is only an example. In another embodiment, the plurality of protrusions 112 may be provided in various other shapes such as an equilateral triangular shape or an equilateral hexagonal shape. Here, each of the plurality of protrusions 112 may have a shape of a post protruding from the upper surface 114 of the base part 111. For example, each of the plurality of protrusions 112 may have a cylindrical shape. The plurality of protrusions 112 may be integrally formed with the base part 111. The metal reflective layer 110 may include, for example, at least one metal material of silver (Ag), aluminum (Al), and gold (Au). However, this is only an example and the embodiment according to the invention is not limited thereto.

Each of the plurality of protrusions 112 may have, for example, a diameter D1 of about 300 nm or less. However, embodiments according to the invention are not limited thereto. For example, each of the plurality of protrusions 112 may have a diameter D1 of approximately 30 nm to 250 nm. Each of the plurality of protrusions 112 may have, for example, a height h1 of about 100 nm or less in the third direction DR3. However, this is only an example.

Optical properties (e.g., a phase delay of reflected light) of the phase modulation surface may be determined by the size (e.g., the diameter D1 and height h1) and the pitch P1 of the plurality of protrusions 112. Thus, a resonance wavelength may be determined by the size and the pitch P1 of the plurality of protrusions 112. In other words, when the resonance wavelength of the micro-cavity L is A, the diameter D1, the height H1 and the pitch P1 of the protrusions 112 of the phase modulation surface may be selected such that the optical length of the micro-cavity L satisfies $n\lambda/2$ (n is a natural number). The light-emitting device 100 of FIG. 1 may be, for example, a red-light-emitting device in which the micro-cavity L is controlled to have a wavelength of red light as a resonance wavelength. Alternatively, the light-emitting device 100 of FIG. 1 may be a green-light-emitting device in which the micro-cavity L is controlled to have a wavelength of green light as a resonance wavelength.

The plurality of recesses 113 may be defined to have a depth h2 in the upper surface 114 of the base part 111. The plurality of recesses 113 may be provided at a regular interval of a pitch P2 between the plurality of protrusions 112. FIG. 3 illustrates, as an example, a case in which the plurality of recesses 113 are provided between adjacent protrusions 112. Here, each of the plurality of recesses 113 may be formed in a cylindrical shape. As described below, the plurality of recesses 113 may absorb light of a wavelength for which resonation is not desired.

Each of the plurality of recesses 113 may have, for example, a diameter D2 of about 250 nm or less. As an example, each of the plurality of recesses 113 may have a diameter D2 of about 80 nm to about 250 nm, but the invention is not limited thereto. Each of the plurality of recesses 113 may have, for example, a height h2 of about 100 nm or less. However, this is only an example. The difference between the diameter D1 of the protrusion 112 and the diameter D2 of the recess 113 may be, for example, about 100 nm or less, but embodiments according to the invention are not limited thereto.

FIG. 4A illustrates an example in which short-wavelength light flows into a recess defined in a surface of a metal mirror. FIG. 4B illustrates an example in which long-wavelength light is blocked from the surface of the metal mirror having the recess.

Short-wavelength light flows into a recess 11 which has a nano size and is formed in a surface of a metal mirror 10, and thus is absorbed into the recess 11 as illustrated in FIG. 4A, whereas long-wavelength light does not flow into the recess 11 and is reflected from the surface of the metal mirror 10 as illustrated in FIG. 4B.

A wavelength of the light absorbed into the recess 11 in the surface of the metal mirror 10 may vary according to the size of the recess 11. For example, blue light having a wavelength of about 450 nm may be absorbed by a recess having a diameter of about 190 nm and formed in a surface of a flat silver (Ag) mirror having no protrusions, and green light having a wavelength of about 550 nm may be absorbed by a recess having a diameter of about 244 nm.

In a display apparatus using an organic light-emitting device, secondary resonance of a wavelength, for which resonation is desired, in a micro-cavity may be used due to a limit in a physical thickness of a light-emitting part. For example, the secondary resonance of a red-light wavelength of about 600 nm occurs in a micro-cavity of a red-light-emitting device. However, in this case, a third resonance of a blue-light wavelength of about 400 nm may also occur, and thus color purity may decrease. In the present embodiment, the plurality of protrusions 112 and the plurality of recesses 113 having a nano size may be provided in the phase modulation surface of the metal reflective layer 110 such that light of a wavelength for which resonation is not desired may be absorbed by the plurality of recesses 113, thereby improving color purity.

FIG. 5 illustrates an example in which light resonates in a light-emitting device according to an embodiment. FIG. 5 illustrates a light-emitting device 100 which is a red-light-emitting device, in which only a metal reflective layer 110 and a second electrode 132 which form a micro-cavity L are shown for convenience of explanation.

Referring to FIG. 5, in the micro-cavity L, red light R does not flow into recesses 113 provided in a surface of the metal reflective layer 110 and is reflected from the surface of the metal reflective layer 110, while blue light B of a wavelength shorter than the wavelength of the red light R flows into the recesses 113 in the surface of the metal reflective layer 110 and thus is absorbed into the recesses 113. As described above, each of the recesses 113 may have, for example, a diameter of about 250 nm or less. Accordingly, only the red light R may resonate in the micro cavity L and be then discharged to the outside.

Although a case in which the light-emitting device 100 according to an embodiment is a red-light-emitting device has been described above as an example, the light-emitting device 100 may be a green-light-emitting device in another embodiment. In general, in a flat micro-cavity in a metal reflective layer, a third resonance of an ultraviolet-region wavelength occurs while the second resonance of a green-light wavelength occurs, thereby preventing an influence on a display apparatus in a visible-light range. However, in a micro-cavity with a metal reflective layer having a meta structure surface, a third resonance of a blue-light wavelength may occur due to phase modulation. In addition, because the optical length varies according to a refractive index and thickness of a dielectric layer 120 provided to protect the meta structure surface of the metal reflective layer 110, a resonance wavelength may vary and thus undesired blue light of a short wavelength may be emitted from a green-light-emitting device in which a green-light wavelength resonates. Therefore, even when the light-emitting device 100 is a green-light-emitting device, a plurality of recesses 113 may be provided in a surface of the metal reflective layer 110 to suppress the emission of undesired blue light, thereby improving color purity.

As described above, the plurality of recesses 113 may be defined in a phase modulation surface of the metal reflective layer 110, such that long-wavelength light (e.g., red light or green light) for which resonation is desired may be discharged by resonance, and short-wavelength light (e.g., blue light) for which resonation is not desired may be absorbed by the plurality of recesses 113, thereby improving color purity.

FIG. 6 is a plan view of another example of a metal reflective layer which may be employed in the light-emitting device of FIG. 1.

A case in which the protrusions 112 are provided at regular intervals in a square shape and the recesses 113 are provided between protrusions 112 adjacent in the direction DR1 (i.e., the horizontal direction in FIG. 3) or the direction DR2 (i.e., the vertical direction in FIG. 3) as illustrated in FIG. 3 has been described in the above-described embodiment. In FIG. 6, in a metal reflective layer 110', protrusions 112' protruding from an upper surface 114' of a base part 111' are provided at regular intervals in a square shape, and recesses 113' defined to a certain depth in the upper surface 114' of the base part 111' are provided between protrusions 112' adjacent in a diagonal direction. However, this is only an example, and the protrusions 112' and the recesses 113' may be arranged in various other forms in another embodiment.

FIG. 7 is a perspective view of another example of a metal reflective layer which may be employed in the light-emitting device of FIG. 1.

A case in which each of the protrusions 112 has a cylindrical shape and the recesses 113 are defined in a circular shape as illustrated in FIG. 2 has been described in the above-described embodiment. In a metal reflective layer 410 illustrated in FIG. 7, each of protrusions 412 has a square pillar shape. Here, a maximum width of the protrusion 412 may correspond to a diameter of the protrusion 412 of FIG. 2. Recesses 413 are provided in the circular shape between protrusions 412 adjacent in the second direction DR2 or third direction DR3. However, this is only an example, and each of the protrusions 412 may have any of various polyprism shapes such as a triangular prism and a pentagonal prism in another embodiment. Similarly, each of the recesses 413 may be provided in various forms.

FIG. 8 illustrates a light-emitting device according to a comparative example. A light-emitting device 200 of FIG. 8 is the same as the light-emitting device 100 of FIG. 1 except that recesses are not provided on a phase modulation surface of a metal reflective layer 210.

Referring to FIG. 8, the light-emitting device 200 includes a metal reflective layer 210 having a phase modulation surface, a first electrode 131 on the metal reflective layer 210, an organic emission layer 140 on the first electrode 131, and a second electrode 132 on the organic emission layer 140.

The phase modulation surface is provided on a reflective surface (i.e., upper surface) of the metal reflective layer 210 for phase-shift control. The metal reflective layer 210 includes a base part 211 and a phase modulation surface on an upper surface of the base part 211. Here, the phase modulation surface includes a plurality of protrusions 212 that are provided at regular intervals on the upper surface of the base part 211.

Accordingly, a micro-cavity L may be provided between the metal reflective layer 210 and the second electrode 132. For example, light generated from the organic emission layer 140 may resonate while reciprocating between the metal reflective layer 210 and the second electrode 132, and thereafter light corresponding to a resonance wavelength of the micro-cavity L may be discharged to the outside via the second electrode 132.

Optical properties (e.g., a phase delay of reflected light) of the phase modulation surface may be determined by the size (e.g., a diameter and a height) and a pitch of the plurality of protrusions 212. Accordingly, the resonance wavelength of the micro-cavity L may be determined by the diameter, height, and pitch of each of the protrusions 212 of the phase modulation surface.

FIG. 9 illustrates the resonance of light in the light-emitting device 200 of FIG. 8. FIG. 9 illustrates the light-emitting device 200, e.g., a red-light-emitting device, in which only a metal reflective layer 210 and a second electrode 132 which form a micro-cavity L are shown for convenience of explanation.

Referring to FIG. 9, in the micro cavity L, red light R resonates while being reflected from a phase modulation surface of the metal reflective layer 210. However, blue light B also resonates while being reflected from the phase modulation surface of the metal reflective layer 210. This is because as described above, in the micro-cavity L of the light-emitting device 200 which is a red light-emitting device, the secondary resonance of a red-light wavelength of about 600 nm occurs, and third resonance of a blue-light wavelength of about 400 nm also occurs, since there is no recess of a small diameter. Accordingly, not only red light R but also blue light B may be emitted from the light-emitting device 200 of FIG. 9 and thus color purity may be reduced.

FIG. 10 illustrates a comparison between a spectrum of light emitted from a light-emitting device with a metal reflective layer having a flat surface and a spectrum of light emitted from a light-emitting device with a metal reflective layer having nano-sized recesses in a surface thereof. In FIG. 10, "A" represents the light-emitting device in which the metal reflective layer has the flat surface, and "B" represents the light-emitting device in which the nano-sized recesses are defined in the surface of the metal reflective layer. Here, red-light-emitting devices are used as the light-emitting devices and silver (Ag) is used as metal reflective layers. X axis represents a wavelength of the light in nanometers and Y axis represents intensity of the light.

Referring to FIG. 10, in the light-emitting device A with the metal reflective layer having the flat surface, strong resonance occurs in a red-light wavelength range, thus causing emission of red light, and resonance also occurred in a blue-light wavelength range, thus causing emission of blue light. In contrast, in the light-emitting device B with the metal reflective layer having the nano-sized recesses in the surface thereof, blue light is absorbed by the recesses, thus greatly reducing emission of blue light, and strong resonance occurred in a red-light wavelength range, thus causing emission of high-intensity red light.

Spectrums of light-emitting devices according to comparative examples and spectrums of light-emitting devices according to embodiments are compared and described below. In light-emitting device according to the embodiments described below, an arrangement of protrusions and recesses of each metal reflective layer is as illustrated in FIG. 6. Here, the metal reflective layer is formed of silver (Ag) and a second electrode is formed of a mixed layer of silver (Ag) and magnesium (Mg). A dielectric layer covering a reflective surface of the metal reflective layer is formed of a material having a refractive index of 1.5.

FIG. 11 illustrates a comparison between a spectrum of light emitted from a light-emitting device of a first comparative example and a spectrum of light emitted from a light-emitting device of a first embodiment. In FIG. 11, "A1" represents the light-emitting device of the first comparative example and "B1" represents the light-emitting device of the first embodiment. Here, green-light-emitting devices are used as the light-emitting device A1 of the first comparative example and the light-emitting device B1 of the first embodiment.

In the light-emitting device B1 of the first embodiment, a diameter and height of the protrusions on the reflective surface of the metal reflective layer are respectively about 100 nm and about 23 nm, and a pitch of the protrusions is about 200 nm. A diameter and depth of recesses are respectively about 100 nm and about 20 nm. A dielectric layer covering the reflective surface of the metal reflective layer has a thickness of about 20 nm from upper surfaces of the protrusions. The light-emitting device A1 of the first comparative example is the same as the light-emitting device B1 of the first embodiment, except that recesses are not provided.

Referring to FIG. 11, in the light-emitting device A1 of the first comparative example, green light is emitted due to strong resonance occurring in a green-light wavelength range for which resonation is desired, and at the same time, unnecessary blue light is emitted due to resonance occurring in a blue-light wavelength range. However, in the light-emitting device B1 of the first embodiment, blue light is absorbed by the recesses, thus greatly reducing emission of unnecessary blue light, and high-intensity green light is emitted.

FIG. 12 illustrates a comparison between a spectrum of light emitted from a light-emitting device of a second comparative example and a spectrum of light emitted from a light-emitting device of a second embodiment. In FIG. 12, "A2" represents the light-emitting device of the second comparative example and "B2" represents the light-emitting device of the second embodiment. Here, red-light-emitting devices are used as the light-emitting device A2 of the second comparative example and the light-emitting device B2 of the second embodiment.

In the light-emitting device B2 of the second embodiment, a diameter and height of protrusions on a reflective surface of a metal reflective layer are respectively about 100 nm and about 58 nm, and a pitch of the protrusions is about 200 nm. A diameter and depth of recesses are respectively about 80 nm and about 20 nm. A dielectric layer covering the reflective surface of the metal reflective layer has a thickness of about 20 nm from upper surfaces of the protrusions. The light-emitting device A2 of the second comparative example is the same as the light-emitting device B2 of the second embodiment, except that recesses are not provided.

Referring to FIG. 12, in the light-emitting device A2 of the second comparative example, red light is emitted due to strong resonance occurring in a red-light wavelength range for which resonation is desired, and at the same time, unnecessary blue light is emitted due to resonance occurring in a blue-light wavelength range. However, in the light-emitting device B2 of the second embodiment, blue light is absorbed by the recesses, thus greatly reducing emission of unnecessary blue light, and high-intensity red light is emitted.

FIG. 13 illustrates a comparison between a spectrum of light emitted from a light-emitting device of a third comparative example and a spectrum of light emitted from a light-emitting device of a third embodiment. In FIG. 13, "A3" represents the light-emitting device of the third comparative example and "B3" represents the light-emitting device of the third embodiment. Here, red-light-emitting devices are used as the light-emitting device A3 of the third comparative example and the light-emitting device B3 of the third embodiment.

In the light-emitting device B3 of the third embodiment, a diameter and a height of protrusions on a reflective surface of a metal reflective layer are respectively about 100 nm and about 60 nm, and a pitch of the protrusions is about 200 nm. A diameter and depth of recesses are respectively about 80 nm and about 40 nm. A dielectric layer covering the reflective surface of the metal reflective layer has a thickness of about 50 nm from upper surfaces of the protrusions. The light-emitting device A3 of the third comparative example is the same as the light-emitting device B3 of the third embodiment, except that recesses are not provided.

Referring to FIG. 13, in the light-emitting device A3 of the third comparative example, red light of a wavelength for which resonation is desired is emitted and unnecessary blue light is also emitted. However, in the light-emitting device B3 of the third embodiment, blue light is absorbed by the recesses, thus greatly reducing emission of unnecessary blue light, and high-intensity red light is emitted.

FIG. 14 is a comparison between color coordinates of light emitted from the light-emitting devices A1, A2 and A3 of the first, second and third comparative examples and color coordinates of light emitted from the light-emitting devices B1, B2 and B3 of the first, second and third embodiments. The color coordinates illustrated in FIG. 14 are CIE 1934 color coordinates.

Referring to FIG. 14, blue light is less generated in the light-emitting devices of the first, second, and third embodiments than in the light-emitting devices of the first, second, and third comparative examples, thereby obtaining purer red light and green light. In detail, color coordinates of red light may be in a range of about $0.58 < CIEx < $ about $0.73$ and a range of about $0.27 < CIEy < $ about $0.40$, and color coordinates of green light may be in a range of about $0.15 < CIEx < $ about $0.30$ and a range of about $0.65 < CIEy < $ about $0.8$.

According to the above embodiments, a phase modulation surface of a metal reflective layer having a micro-cavity includes a plurality of protrusions that are smaller in size than a wavelength of incident light and are provided at regular intervals, and resonance of a desired wavelength may be easily induced by adjusting the size and pitch of the plurality of protrusions.

In addition, a plurality of recesses may be provided in the phase modulation surface of the metal reflective layer so that light of a wavelength for which resonation is desired (e.g., red light or green light) may be emitted to the outside by resonance and light of a wavelength for which resonation is not desired (e.g., blue light) may be absorbed by the plurality of recesses, thereby improving color purity.

A display apparatus employing a light-emitting device according to the embodiment described above as a pixel of a certain color will be described below.

FIG. 15 is a cross-sectional view of a display apparatus according to an embodiment.

Referring to FIG. 15, a display apparatus 1000 includes a plurality of pixels emitting light of different colors. Here, the plurality of pixels may include red, green, and blue pixels 1100, 1200, and 1300 located adjacent to each other on the same plane (i.e., the plane defined by the first and second directions DR1 and DR2) of a substrate (not shown). FIG. 15 illustrates only one unit pixel composed of red, green, and blue pixels 1100, 1200, and 1300 for convenience of explanation.

The red pixel 1100 may have the same structure as the light-emitting device 100 of FIG. 1. The red pixel 1100 includes a first metal reflective layer 1110 having a first phase modulation surface, a first electrode 1131 on the first metal reflective layer 1110, an organic emission layer 1140 on the first electrode 1131, and a second electrode 1132 on the organic emission layer 1140. In FIG. 15, reference numbers 1111, 1112, and 1113 denote a base part, a plurality of protrusions, and a plurality of recesses of the first metal reflective layer 1110, respectively. A dielectric layer 1120 may be provided between the first metal reflective layer 1110 and the first electrode 1131 to cover the first phase modulation surface (i.e., the upper surface) of the first metal reflective layer 1110. A structure and function of the red pixel 1100 have been described above and thus a detailed description thereof is omitted.

The green pixel 1200 has the same structure as the light-emitting device of FIG. 8, and includes a second metal reflective layer 1210 having a second phase modulation surface, a first electrode 1131 on the second metal reflective layer 1210, an organic emission layer 1140 on the first electrode 1131, and a second electrode 1132 on the organic emission layer 1140. A dielectric layer 1120 may be provided between the second metal reflective layer 1210 and the first electrode 131 to cover the second phase modulation surface of the second metal reflective layer 1210.

The second phase modulation surface (i.e., the upper surface of the second metal reflective layer 1210) may include a plurality of protrusions 1212 protruding to a predetermined height from an upper surface of a base part 1211. Here, an upper surface of the protrusions 1212 of the second phase modulation surface may be flush with the upper surface of the protrusions 1112 of the first phase modulation surface. However, embodiments according to the invention are not limited thereto. Each of the plurality of protrusions 1212 may have a dimension smaller than a wavelength of incident light.

The blue pixel 1300 includes a third metal reflective layer 1310, a first electrode 1131 on the third metal reflective layer 1310, an organic emission layer 1140 provided on the first electrode 1131, and a second electrode 1132 on the organic emission layer 1140. A dielectric layer 1120 may be provided between the third metal reflective layer 1310 and the first electrode 1131 to cover an upper surface of the third metal reflective layer 1310.

The third metal reflective layer 1310 may define a third micro-cavity together with the second electrode 1132. Here, the upper surface of the third metal reflective layer 1310 may include a flat reflective surface. The third micro-cavity may have a resonance wavelength of blue light B by adjusting structural and optical properties of layers provided between the third metal reflective layer 1310 and the second electrode 1132. Here, the upper surface of the third metal reflective layer 1310 may be flush with the upper surfaces of the protrusions 1112 and 1212 of the first and second phase modulation surfaces. In another embodiment, the upper surface of the third metal reflective layer 1310 may be flush with a bottom surface (i.e., the upper surface of the base part 1111) of the protrusions 1112 of the first phase modulation surface. However, embodiments according to the invention are not limited thereto, and the upper surface of the third metal reflective layer 1310 may be formed at various heights in still another embodiment.

Although not shown, the third metal reflective layer 1310 may have a third phase modulation surface having a resonance wavelength of blue light B. In this case, the third phase modulation surface may include a plurality of protrusions protruding to a certain height on the upper surface of the third metal reflective layer 1310.

The first, second, and third metal reflective layers 1110, 1210, and 1310 may include at least one metal material of silver (Ag), aluminum (Al), and gold (Au), but the material of the metal reflective layers according to the invention are not limited thereto. The dielectric layer 1120 provided to cover the first, second, and third metal reflective layers 1110, 1210, and 1310 may include an insulating material that is transparent enough for visible light to pass therethrough.

The first electrode 1131 may be a transparent electrode that transmits light, and the second electrode 1132 may be a semi-transmissive electrode that reflects part of light and transmits part of the light. A passivation layer 1160 may be provided on the second electrode 1132. The organic emission layer 1140 has a structure in which a red organic emission layer, a green organic emission layer, and a blue organic emission layer are sequentially stacked between the first electrode 1131 and the second electrode 1132. A hole injection layer 1151 may be provided between the first electrode 1131 and the organic emission layer 1140, and an electron injection layer 1152 may be provided between the second electrode 1132 and the organic emission layer 1140.

In the display apparatus 1000 having the above structure, red light R generated from the red organic emission layer of the organic emission layer 1140 may resonate while reciprocating between the first metal reflective layer 1110 and the second electrode 1132 and thereafter be emitted from the red pixel 1100 to the outside via the second electrode 1132. In this case, blue light B generated from the blue organic emission layer of the organic emission layer 1140 may be absorbed by the recesses 1113 on the first phase modulation surface of the first metal reflective layer 1110, and thus red light R having improved color purity may be emitted from the red pixel 1100.

Green light G generated from the green organic emission layer of the organic emission layer 1140 may resonate while reciprocating between the second metal reflective layer 1210 and the second electrode 1132 and thereafter be emitted from the green pixel 1200 to the outside via the second electrode 1132. The blue light B generated from the blue organic emission layer of the organic emission layer 1140 may resonate while reciprocating between the third metal reflective layer 1310 and the second electrode 1132 and thereafter be emitted from the blue pixel 1300 to the outside via the second electrode 1132.

According to the present embodiment, the red pixel 1100 includes the plurality of recesses 1113 having a nano size in the first phase modulation surface for absorbing blue light B and thus may generate red light R having improved color purity. In the red pixel 1100 and the green pixel 1200, the first and second phase modulation surfaces include the protrusions 1112 and 1212 that are smaller in size than a wavelength of incident light and are provided at regular intervals, and resonance of a desired wavelength may be easily induced by adjusting the sizes and pitches of the protrusions 1112 and 1212. The display apparatus 1000 may be easily manufactured by forming upper surfaces of the protrusions 1112 and 1212 of the red pixel 1100 and the green pixel 1200 to be flush with an upper surface of the third metal reflective layer 1310 of the blue pixel 1300.

FIG. 16 is a cross-sectional view of a display apparatus according to another embodiment.

Referring to FIG. 16, a display apparatus 2000 may include a red pixel 2100, a green pixel 2200, and a blue pixel 2300 which emit light of red, green, and blue colors, respectively. Here, the red pixel 2100 and the green pixel 2200 may have the same structure as the light-emitting device 100 of FIG. 1. The red pixel 2100 includes a first metal reflective layer 2110 having a first phase modulation surface, and the green pixel 2200 includes a second metal reflective layer 2210 having a second phase modulation surface. In FIG. 16, reference numerals 2111, 2112, and 2113 denote a base part, a plurality of protrusions, and a plurality of recesses of the first metal reflective layer 2110, respectively, and reference numerals 2211, 2212, and 2213 denote a base part, a plurality of protrusions, and a plurality of recesses of the second metal reflective layer 2210, respectively. A structure and function of the red pixel 2100 and the green pixel 2200 have been described above, and thus a detailed description thereof is omitted here. The blue pixel 2300 is as described above with reference to FIG. 15.

In the display apparatus 2000 having the above structure, red light R generated from a red organic emission layer of an organic emission layer 1140 may resonate while reciprocating between the first metal reflective layer 2110 and a second electrode 1132 and thereafter be emitted from the red pixel 2100 to the outside via the second electrode 1132. In this case, blue light B generated from a blue organic emission layer of an organic emission layer 1140 may be absorbed by the recesses 2113 on the first phase modulation surface of the first metal reflective layer 2110, and thus red light R having improved color purity may be emitted from the red pixel 2100.

Green light G generated from the green organic emission layer of the organic emission layer 1140 may resonate while reciprocating between the second metal reflective layer 2210 and the second electrode 1132 and thereafter be emitted from the green pixel 2200 to the outside via the second electrode 1132. In this case, the blue light B generated from the blue organic emission layer of the organic emission layer 1140 may be absorbed by the recesses 2213 defined on the second phase modulation surface of the second metal reflective layer 2210 and thus green light G having improved color purity may be emitted from the green pixel 2200.

The blue light B generated from the blue organic emission layer of the organic emission layer 1140 may resonate while reciprocating between the third metal reflective layer 1310 and the second electrode 1132 and thereafter be emitted from the blue pixel 2300 to the outside via the second electrode 1132.

According to the present embodiment, the red pixel 2100 includes the plurality of recesses 2113 having a nano size in the first phase modulation surface for absorbing blue light B and thus may generate red light R having improved color purity. The green pixel 2200 includes the plurality of recesses 2213 having a nano size in the second phase modulation surface for absorbing blue light B and thus may generate green light G having improved color purity.

In the red pixel 2100 and the green pixel 2200, the first and second phase modulation surfaces include the protrusions 2112 and 2212 that are smaller in size than a wavelength of incident light and are provided at regular intervals, and resonance of a desired wavelength may be easily induced by adjusting the sizes and pitches of the protrusions 2112 and 2212. The display apparatus 2000 may be easily manufactured by forming upper surfaces of the protrusions 2112 and 2212 of the red pixel 2100 and the green pixel 2200 to be flush with an upper surface of the third metal reflective layer 1310 of the blue pixel 2300. While the embodiments have been described above, the embodiments are only examples and thus various modifications may be made therein by those of ordinary skill in the art.

According to the above embodiments, a phase modulation surface of a metal reflective layer having a micro-cavity includes a plurality of protrusions that are smaller in size than a wavelength of incident light and are provided at regular intervals, and resonance of a desired wavelength may be easily induced by adjusting the size and pitch of the plurality of protrusions.

Alternatively, a plurality of protrusions may be provided on the phase modulation surface of the metal reflective layer so that light of a wavelength for which resonation is desired (e.g., red light or green light) may be emitted to the outside by the resonance, and light of a wavelength for which resonation is not desired (e.g., blue light) may be absorbed by a plurality of recesses, thereby improving color purity.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A light-emitting device comprising:
a metal reflective layer having a phase modulation surface on an upper surface thereof, wherein the phase modulation surface is different from the upper surface;
a first electrode on the metal reflective layer;
an organic emission layer provided on the first electrode and which emits white light; and
a second electrode on the organic emission layer,
wherein the phase modulation surface comprises a plurality of protrusions and a plurality of recesses,
wherein the upper surface of the metal reflective layer faces the first electrode, the plurality of protrusions protrudes from the upper surface, the plurality of recesses is recessed from the upper surface, and a height of the upper surface is lower than the plurality of protrusions and higher than the plurality of recesses, wherein an area occupied by each of the plurality of protrusions is greater than an area occupied by each of the plurality of recesses in a plan view, wherein in the plan view the plurality of protrusions and the plurality of recesses are arranged with a repeated pattern, the metal reflective layer includes a plurality of unit regions, which are adjacent to each other and have a same shape and a same area in the plan view, each of the unit regions includes a minimum unit of the repeated pattern, and a total area of the upper surface included in each of the unit regions is greater than a total area of the plurality of recesses included in each of the unit regions in the plan view.

2. The light-emitting device of claim 1, wherein the metal reflective layer and the second electrode define a microcavity of a predetermined resonance wavelength.

3. The light-emitting device of claim 1, wherein a light of a first wavelength resonates by the plurality of protrusions, and a light of a second wavelength is absorbed by the plurality of recesses.

4. The light-emitting device of claim 3, wherein the first wavelength is greater than the second wavelength.

5. The light-emitting device of claim 4, wherein the light of the first wavelength comprises red light or green light.

6. The light-emitting device of claim 5, wherein the light of the second wavelength comprises blue light.

7. The light-emitting device of claim 1, wherein the phase modulation surface has a meta structure in which the plurality of protrusions and the plurality of recesses are provided at regular intervals.

8. The light-emitting device of claim 7, wherein each of the plurality of protrusions and the plurality of recesses has a cylindrical shape or a polyprism shape.

9. The light-emitting device of claim 7, wherein each of the plurality of protrusions and the plurality of recesses has a dimension less than a wavelength of incident light.

10. The light-emitting device of claim 9, wherein each of the plurality of recesses has a diameter of about 80 nanometers (nm) to about 250 nm.

11. The light-emitting device of claim 9, wherein a difference between a diameter of each of the plurality of protrusions and a diameter of each of the plurality of recesses is about 100 nm or less.

12. The light-emitting device of claim 9, wherein each of the plurality of protrusions and the plurality of recesses has a depth of about 20 nm to about 100 nm.

13. The light-emitting device of claim 1, wherein the metal reflective layer comprises at least one metal material of silver (Ag), aluminum (Al) and gold (Au).

14. The light-emitting device of claim 1, further comprising a dielectric layer provided between the metal reflective layer and the first electrode to cover the phase modulation surface of the metal reflective layer.

15. The light-emitting device of claim 1, further comprising a passivation layer on the second electrode.

16. A display apparatus comprising a plurality of pixels which emits light of different colors, wherein at least one of the plurality of pixels comprises:
a metal reflective layer having a phase modulation surface on an upper surface thereof;
a first electrode on the metal reflective layer;
an organic emission layer provided on the first electrode and which emits white light; and
a second electrode on the organic emission layer, wherein the phase modulation surface comprises a plurality of protrusions and a plurality of recesses, wherein the phase modulation surface is different from the upper surface, the upper surface of the metal reflective layer faces the first electrode, the plurality of protrusions protrudes from the upper surface, the plurality of recesses is recessed from the upper surface, and a height of the upper surface is lower than the plurality of protrusions and higher than the plurality of recesses, wherein an area occupied by each of the plurality of protrusions is greater than an area occupied by each of the plurality of recesses in a plan view, wherein in the plan view the plurality of protrusions and the plurality of recesses are arranged with a repeated pattern, the metal reflective layer includes a plurality of unit regions, which are adjacent to each other and have a same shape and a same area in the plan view, each of the unit regions includes a minimum unit of the repeated pattern, and a total area of the upper surface included in each of the unit regions is greater than a total area of the plurality of recesses included in each of the unit regions in the plan view.

17. The display apparatus of claim 16, wherein a light of a first wavelength resonates by the plurality of protrusions, and a light of a second wavelength smaller than the first wavelength is absorbed by the plurality of recesses.

18. The display apparatus of claim 16, wherein each the plurality of protrusions and the plurality of recesses has a dimension less than a wavelength of incident light, and the phase modulation surface has a meta structure in which the plurality of protrusions and the plurality of recesses are provided at regular intervals.

19. The display apparatus of claim 16, wherein a dielectric layer is provided between the metal reflective layer and the first electrode to cover the phase modulation surface of the metal reflective layer.

20. The display apparatus of claim 16, wherein a passivation layer is provided on the second electrode.

21. The display apparatus of claim 16, wherein the plurality of pixels comprises a blue pixel, a green pixel, and a red pixel, wherein the red pixel comprises the plurality of protrusions and the plurality of recesses.

22. The display apparatus of claim 16, wherein the plurality of pixels comprises a blue pixel, a green pixel, and a red pixel, wherein each of the red pixel and the green pixel comprises the plurality of protrusions and the plurality of recesses.

23. A light-emitting device comprising:
a metal reflective layer;
a second electrode spaced apart from the metal reflective layer;
a first electrode between the metal reflective layer and the second electrode; and
an emission layer which emits a visible light and located between the first electrode and the second electrode, wherein the visible light comprises a light of a first wavelength and a light of a second wavelength, wherein the metal reflective layer comprises a surface facing the first electrode, a plurality of protrusions protruding from the surface, and a plurality of recesses recessed from the surface, and a height of the surface is lower than the plurality of protrusions and higher than the plurality of recesses, wherein an area occupied by each of the plurality of protrusions is greater than an area occupied by each of the plurality of recesses in a plan view, wherein in the plan view the plurality of protrusions and the plurality of recesses are arranged with a repeated pattern, the metal reflective layer includes a plurality of unit regions, which are adjacent to each other and have a same shape and a same area in the plan view, each of the unit regions includes a minimum unit of the repeated pattern, and a total area of the upper surface included in each of the unit regions is greater than a total area of the plurality of recesses included in each of the unit regions in the plan view.

24. The light-emitting device of claim 23, wherein the light of the first wavelength resonates by the plurality of protrusions, and the light of the second wavelength is absorbed by the plurality of recesses.

25. The light-emitting device of claim 23, wherein an area of the surface is greater than an area occupied by the plurality of protrusions in a plan view.

26. The light-emitting device of claim 23, wherein an area of the surface is greater than an area occupied by the plurality of recesses in a plan view.

27. The light-emitting device of claim 23, wherein the visible light comprises white light.

28. The light-emitting device of claim 23, wherein the emission layer comprises an organic emission layer.

29. The light-emitting device of claim 23, wherein the light of the first wavelength comprises red light, and the light of the second wavelength comprises blue light.

30. The light-emitting device of claim 23, wherein the light of the first wavelength comprises green light, and the light of the second wavelength comprises blue light.

31. The light-emitting device of claim 23, wherein each of the plurality of protrusions and the plurality of recesses has a dimension less than a wavelength of the visible light.

32. The light-emitting device of claim 23, wherein each of the plurality of recesses has a diameter of about 80 nm to about 250 nm.

33. The light-emitting device of claim 23, further comprising a dielectric layer provided to cover the surface, the plurality of protrusions, and the plurality of recesses.

* * * * *